United States Patent [19]

Itoyama

[11] Patent Number: 5,172,053
[45] Date of Patent: Dec. 15, 1992

[54] PROBER APPARATUS

[75] Inventor: Taketoshi Itoyama, Tokorozawa, Japan

[73] Assignee: Tokyo Electron Limited, Tokyo, Japan

[21] Appl. No.: 726,725

[22] Filed: Jul. 1, 1991

Related U.S. Application Data

[63] Continuation of Ser. No. 539,310, Jun. 18, 1990, abandoned, which is a continuation of Ser. No. 314,898, Feb. 24, 1989, abandoned.

[51] Int. Cl.$^5$ .............................. G01R 1/04
[52] U.S. Cl. .................. 324/158 F; 324/72.5; 324/158 P
[58] Field of Search ............... 324/72.5, 158 P, 158 F

[56] References Cited

U.S. PATENT DOCUMENTS

| 3,437,929 | 4/1969 | Glenn | 324/158 F |
|---|---|---|---|
| 3,493,858 | 2/1970 | Baron et al. | 324/158 P |
| 3,651,401 | 3/1972 | Cooney | 324/158 F |
| 3,866,119 | 2/1975 | Ardezzone et al. | 324/158 F |
| 4,103,232 | 7/1978 | Sugita et al. | 324/158 F |
| 4,266,191 | 5/1981 | Spano et al. | 324/158 F |
| 4,518,914 | 5/1985 | Okubo et al. | 324/158 F |
| 4,574,235 | 3/1986 | Kelly et al. | 324/158 F |
| 4,590,422 | 5/1986 | Mulligan | 324/158 F |
| 4,649,339 | 3/1987 | Grangroth et al. | 324/158 F |
| 4,665,360 | 5/1987 | Phillips | 324/158 F |
| 4,686,463 | 8/1987 | Logan | 324/158 F |
| 4,724,377 | 2/1988 | Maelzer et al. | 324/158 F |
| 4,755,747 | 7/1988 | Sato | 324/158 F |
| 4,823,211 | 5/1989 | Strid et al. | 324/158 P |
| 4,891,585 | 1/1990 | Janko et al. | 324/72.5 |
| 4,904,933 | 2/1990 | Snyder et al. | 324/158 F |
| 4,926,118 | 5/1990 | O'Connor et al. | 324/158 F |

FOREIGN PATENT DOCUMENTS

| 58-209134 | 12/1983 | Japan . |
| 59-72148 | 4/1984 | Japan . |
| 61-43854 | 9/1986 | Japan . |
| 63-50034 | 3/1988 | Japan . |
| 2-137347 | 5/1990 | Japan . |
| 2-224260 | 9/1990 | Japan . |

Primary Examiner—Ernest F. Karlsen
Assistant Examiner—William J. Burns
Attorney, Agent, or Firm—Oblon, Spivak, McClelland, Maier & Neustadt

[57] ABSTRACT

A prober apparatus includes a test head for generating a test signal. A probe card is fixed removably on the test head. The probe card supplies the test signal to a test piece when the probe card electrically contacts the test piece, and tests electric characteristics of the test piece.

4 Claims, 9 Drawing Sheets

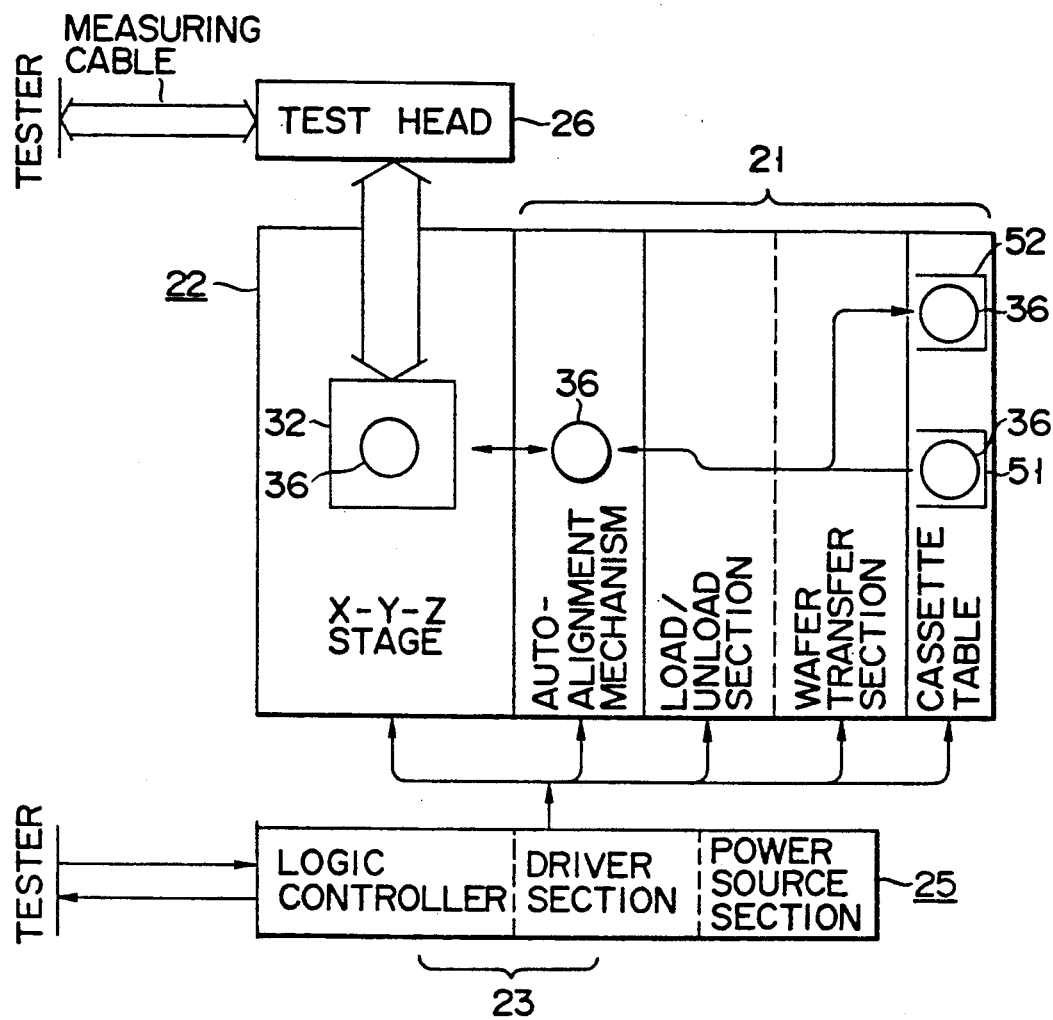
F I G. 5

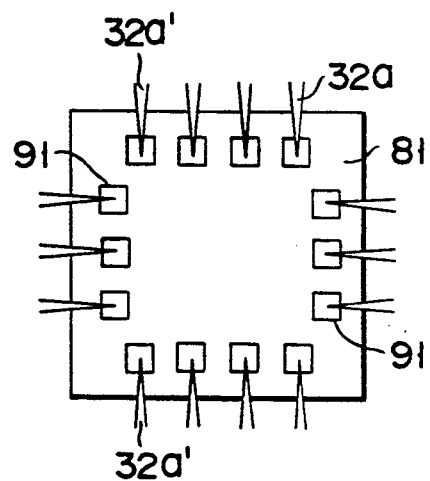
F I G. 13
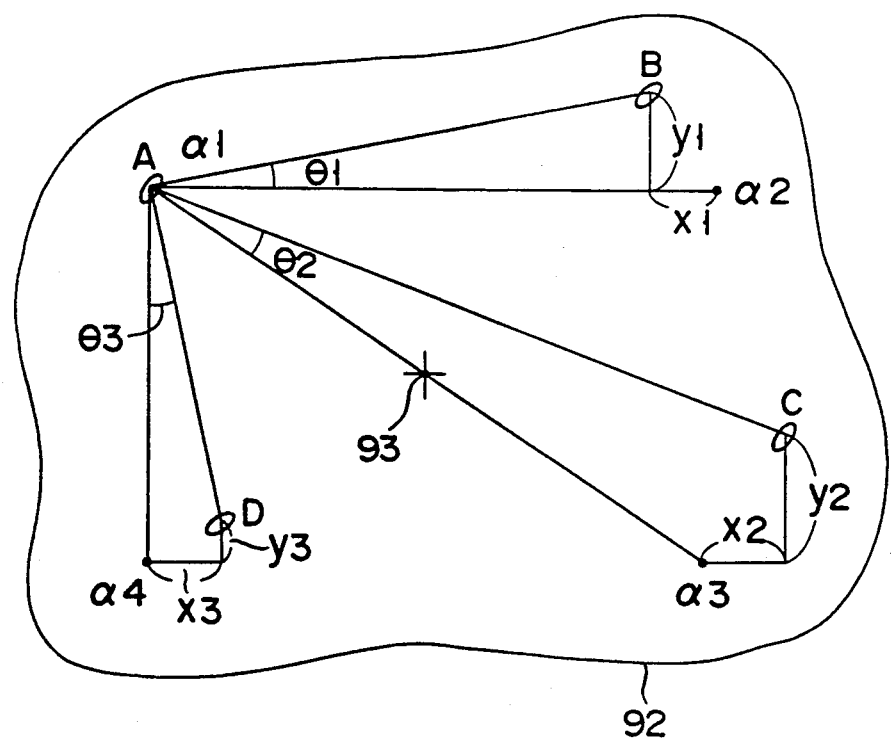
F I G. 14

PROBER APPARATUS

This application is a continuation of application Ser. No. 07/539,310, filed Jun. 18, 1990, now abandoned which is a continuation of application Ser. No. 07/314,898, filed on Feb. 24, 1989, now abandoned.

BACKGROUND OF THE INVENTION

1. Field or the Invention

The present invention relates to a prober apparatus, in particular, for testing electric characteristics of chips formed on a semiconductor wafer.

2. Description of the Related Art

In a process of manufacturing semiconductor devices, the electric characteristics of the devices are tested within a wafer after the completion of each processing step and before the start of an assembling step. This test is called a wafer test, by which undesirable devices are detected and, if necessary are rejected. The apparatus for this test is called a wafer prober.

A wafer test system for performing the above-mentioned test basically comprises two units, that is, a tester and a wafer prober which are connected by a measuring line. In response to a TEST START command from a test controlling line, the wafer prober automatically impresses marks on defective chips in accordance with a TEST COMPLETE signal or a FAIL signal. In this manner, other chips are sequentially probed. The tester receives a WAFER END signal from the prober and automatically performs a test for one wafer. Also, it collects test data and performs a processing for one lot in response to a CARRIER END signal from the wafer prober.

A wafer prober, in which a test head of a tester is mounted on a head plate of the wafer prober (so-called HF type), is well known. See U.S. Pat. Nos. 3,493,858 and 3,866,119 and Japanese Patent Disclosure Nos. 58-209134, 59-72148 and 61-43854. This type of wafer prober will now be described with reference to FIG. 1.

As shown in FIG. 1, insert ring 2 is mounted in head plate 1. Contact board 3 is disposed on the upper surface of insert ring 2. Card socket 4 is attached on the lower surface of insert ring 2. Contact board 3 and card socket 4 are connected by cable 5. Probe card 6 is attached to card socket by pogo-pin or socket 7. High-frequency test head 8 arranged above head plate 1 has performance board 9 on its lower surface. Performance board 9 and contact board 3 are connected by pogo-pin 10. Mounting table (chuck top) 11, on which wafer 12 is mounted, is arranged below probe card 6. The horizontal angle adjustment ($\theta$ adjustment) between needles 6a of probe card 6 and bonding pads of each chip of wafer 12 is performed by $\theta$ rotation mechanism 13 connected to insert ring 2.

In the above wafer prober, performance board 9 and probe card 6 are electrically connected through pogo-pin 10, contact board 3, cable 5, card socket 4 and pogo-pin 7. Thus, the connection path is long. In addition, $\theta$ rotation mechanism 13 is connected to insert ring 2 for positioning each after exchange of probe cads. This renders a head plate/insert ring section necessary to have a thickness of about 50 mm. Under the circumstances, the length of the connection path between probe card 6 and performance board 8 is very long, that is, about 80 mm.

In view of the precision of the test, as the length of the connection path between performance board 9 and probe card 6 becomes large, the electric characteristics of the prober itself is degraded by a problem in measuring timing or an increase in a capacitive load, and test precision is lowered. It is thus possible that the characteristics of the semiconductor chip measured by the prober is judged to be inferior to the actual characteristics thereof. In addition, since the length of the connection path is large, even if a test head has the performance of generating a high-frequency signal of, for example, 20 MHz, effective signal level may be lowered to 10 to 15 MHz due to properties of the probe card. Even if a 100 MHz test head is used, effective signal level at the probe card may be lowered to 70 to 80 MHz.

SUMMARY OF THE INVENTION

An object of the present invention is to provide a prober apparatus wherein the test precision is enhanced and the high frequency characteristics are not so much degraded.

In the present invention, in a prober apparatus of the type in which a test head of a tester is mounted, a conventional insert ring is omitted, and a probe card is removably fixed to the test head.

A prober apparatus of the present invention comprises:

test head means for generating a test signal; and probe card means, removably fixed to the test head means, for supplying the test signal to a test piece by electrically contacting the test piece, and testing the characteristics of the test piece.

BRIEF DESCRIPTION OF THE DRAWINGS

FIG. 5 is a view for explaining the operation of the wafer prober apparatus of the present invention;

FIGS. 8 to 15 are views for explaining the positioning process using the apparatus of FIG. 7.

DETAILED DESCRIPTION OF THE PREFERRED EMBODIMENTS

Figure 1:
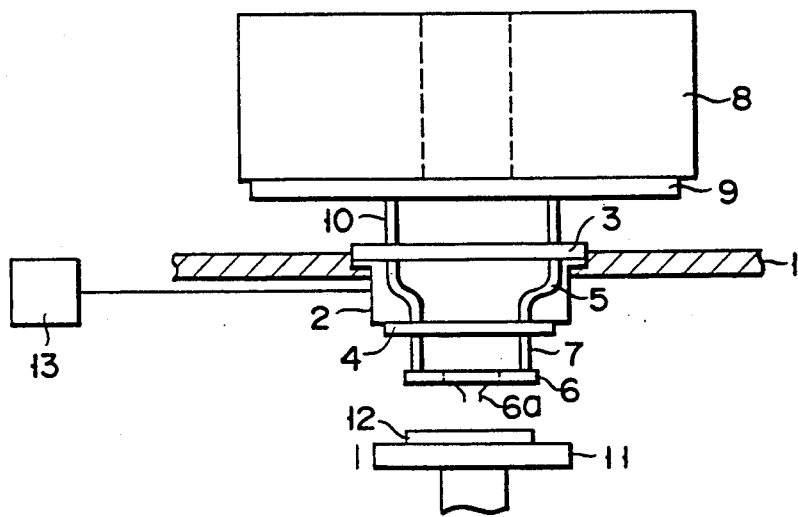
FIG. 1 partly shows a conventional test head mounting type wafer prober.

The present invention will now be described in detail with reference to FIGS. 2 to 17. In these figures, the same reference numerals indicate the same elements.

Figure 2:
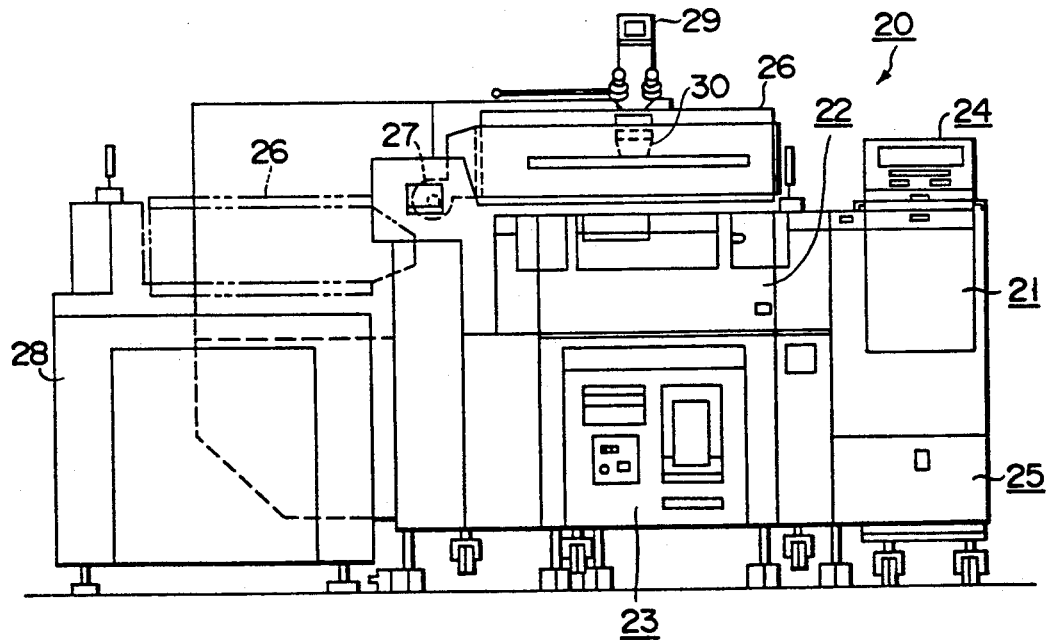
FIG. 2 is a plan view of the outer appearance of a test head mounting type wafer prober apparatus.

FIG. 2 shows automatic wafer prober apparatus 20 for testing electric characteristics (high-frequency wave characteristic, etc.) of a semiconductor wafer. Apparatus 20 includes autoloader mechanism section 21 for autoloading a wafer and probe mechanism section 22. These sections are controlled by control mechanism 23 and operated by keyboard 24. Reference numeral 25 indicates a power source section.

Above probe mechanism section 22, high-frequency wave test head 26 (described later) is rotatably arranged via hinge 27. At the time of the test, test head 26 is arranged so as to face the upper surface of probe mechanism section 22, as shown by a solid line. On the other hand, when the test is not performed, test head 26 is placed on side desk 28, as shown by a two-dot-and-dash line. Magnification mechanism 29 including microscope 30 is mounted on test head 26. Magnification mechanism 29 is used for magnifying and observing a contact area between needles of a probe card and bonding pads of a semiconductor chip.

Figure 3:
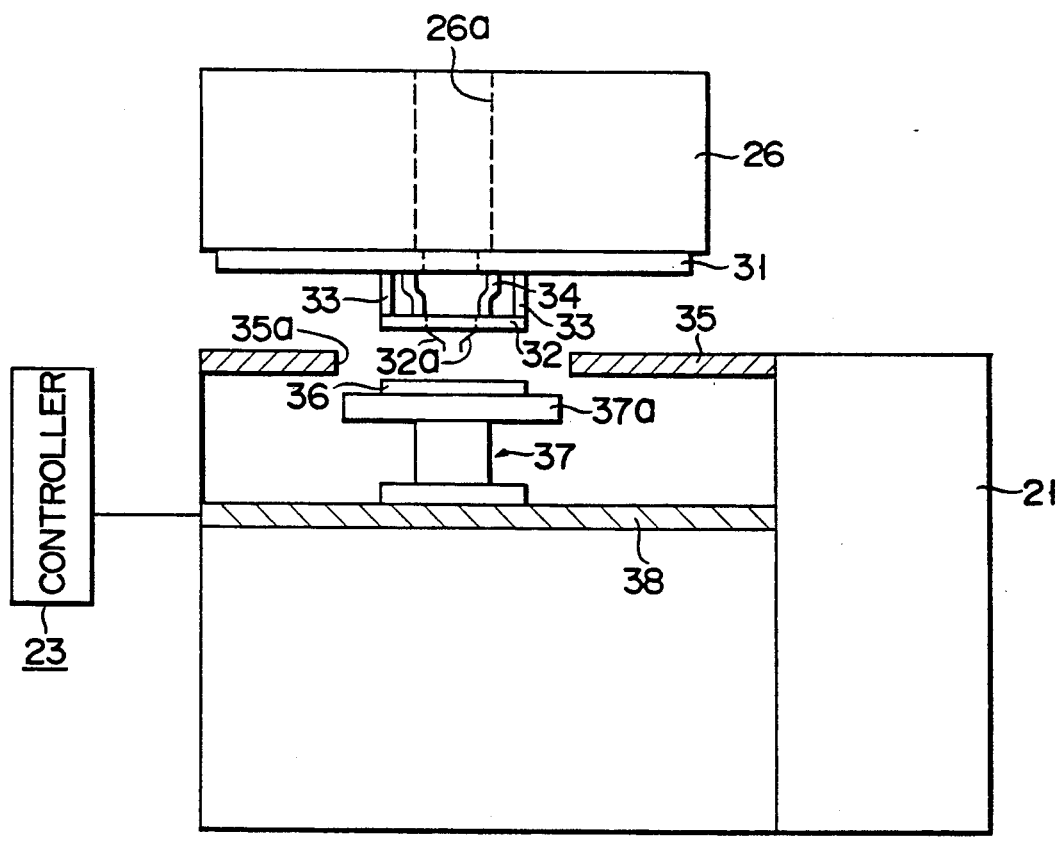
FIG. 3 partly shows a test head mounting type wafer prober apparatus according to the present invention.

With reference to FIG. 3, the wafer prober apparatus of the present invention will be described in more detail. High-frequency wave test head 26 which is known per se has hole 26a for insertion of a microscope. Under the lower surface of test head 26, performance board 31, which is known per se and on which a circuit capable of relay selection in accordance with a test program is mounted, is arranged. Probe card 32 is removably fixed in place on performance board 31, for example, by screw 33. As is well known to a skilled person, probe card 32 has needles 32a, the number of which corresponds to the number of bonding pads of each chip formed on a semiconductor wafer to be tested. Performance board 31 and probe card 32 are electrically connected to one another by pogo-pins or wire cables 34.

Head table 35 has opening 35a corresponding to an area where an insert ring with a conventional contact board is provided.

Semiconductor wafer 36 to be tested is mounted on chuck top (mounting table) 37a provided with chuck mechanism 37. Chuck mechanism 37 is mounted on X-Y-Z-$\theta$ stage 38.

Figure 4:
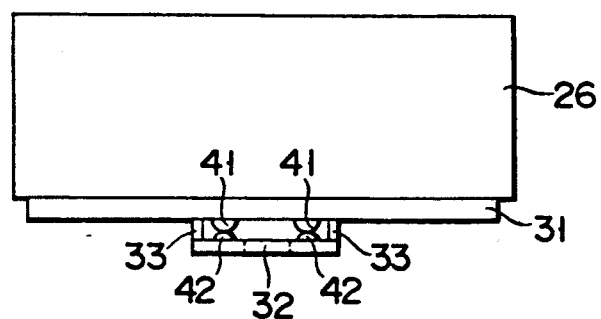
FIG. 4 shows another mode of a test head - probe card used in the prober apparatus of the present invention.

Performance board 31 and probe card 32 may be connected not by pogo-pins or cables 34, but by firmly abutting contact pads 41 provided on performance board 31 with corresponding contact pads 42 provided on probe card 32 by screws 33, as shown in FIG. 4. Namely, performance board 31 and probe card 32 can be face-contacted.

The operation mechanism of the wafer prober apparatus of the invention having the above structure will now be briefly described with reference to FIG. 5.

In autoloader mechanism section 21, wafer cassette 51 is set on a cassette table. In a wafer transfer section, one wafer 36 is pulled out of wafer cassette 51, or a tested wafer taken out of a main chuck is stored in wafer cassette 52. In a load/unload section, the wafer transferred by the wafer transfer section is mounted on the main chuck, or the wafer on the main chuck is shifted on the wafer transfer section. The main function of an auto-alignment mechanism is to subject the wafer mounted on the main chuck to $\theta$ adjustment with respect to, for example, an orientation flat of the wafer.

In probe mechanism section 22, the X-Y-Z-$\theta$ stage is driven so as to bring the needles of probe card 32 into precise contact with the bonding pads of each chip on wafer 36. In response to a command from a tester, a high-frequency test signal is supplied from test head 26 to the semiconductor chip through probe card 32, thereby to test the electric characteristics of the chip. Autoloader mechanism section 21 and probe mechanism section 22 are controlled, in accordance with commands from the tester, by control section 23 comprising a logic controller and a driver. When a FAIL signal is generated from the tester during the test, a mark may be put on a defective chip by an inker driving section (not shown).

The positioning between probe card 32 and wafer 36 on chuck top 37a will now be described.

The positioning in the Z-direction will be described later. At first, the positioning in an angular ($\theta$) direction will be explained. In the wafer prober apparatus of the present invention, probe card 32 is fixed on test head 26. Thus, the positioning in the angular direction is performed by the rotational operation of stage 38.

More specifically, when probe card 32 is displaced from chuck top 37a by an angle $\theta$ with respect to X-Y axes, only chuck top 37a is moved and adjusted at an alignment section (not shown), thus positioning the arrangement of semiconductor chips and probe card 32, without moving probe card 32. In this manner, chip C1 is measured. Then, based on the displacement angle $\theta$ of chuck top 37a, the distances of movement in the X- and Y-directions is calculated by the formulas:

$$x = a \cos \theta, y = a \sin \theta$$

(where x indicates a distance of movement in the X-direction of the chuck top, y indicates a distance of movement in the Y-direction of the chuck top, and a denotes a width of a chip formed on the wafer)

Figure 6:
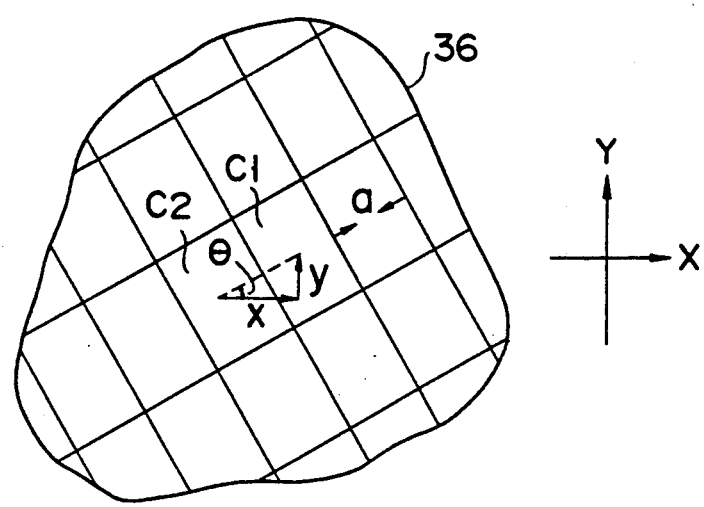
FIG. 6 shows a wafer for explaining the positioning.

In accordance with the calculated distances of movement, stage 38 is moved in the X- and Y-directions, and thereafter a test of the next chip C2 is performed (see FIG. 6). Note that by not moving probe card 32, the wiring length between probe card 32 and test head 26 can be shortest.

A process of automatic positioning in a horizontal or angular direction will now be described with reference to FIGS. 7 to 12. This process is disclosed in Japanese Patent Application No. 63-278389 filed on Nov. 2, 1988 (inventors: Keiichi Yokota and Ryuichi Takebuchi, Applicant: Tokyo Electron Kabushiki Kaisha).

Figure 7:
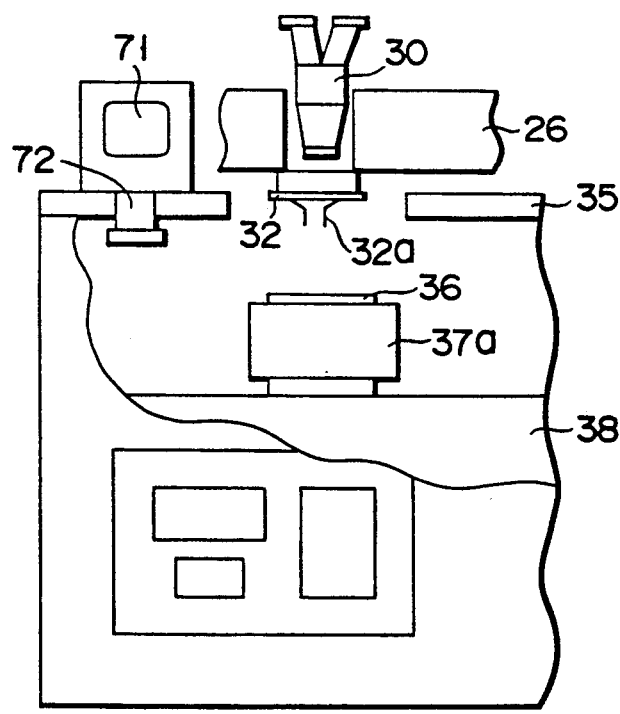
FIG. 7 shows another embodiment of the wafer prober apparatus of the present invention.

FIG. 7 shows a wafer prober apparatus for performing the above automatic $\theta$ positioning. The structure of this apparatus is identical to that of the apparatus shown in FIGS. 2 and 3, excepting the provision of alignment optical spot 72 and camera 71 connected to optical spot 72.

In a pre-alignment stage (not shown), orientation flat 36a of wafer 36 is detected (see FIG. 8), thereby to perform a pre-alignment step. Wafer 36, after it was subjected to the pre-alignment step, is mounted on measuring table 37a to perform fine alignment.

Figure 8:
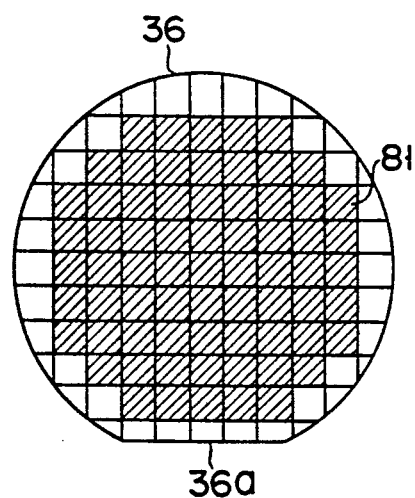
Figure 9A:
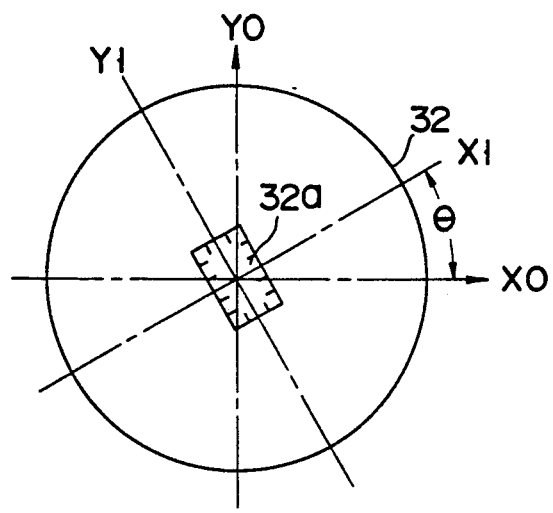
Figure 9B:
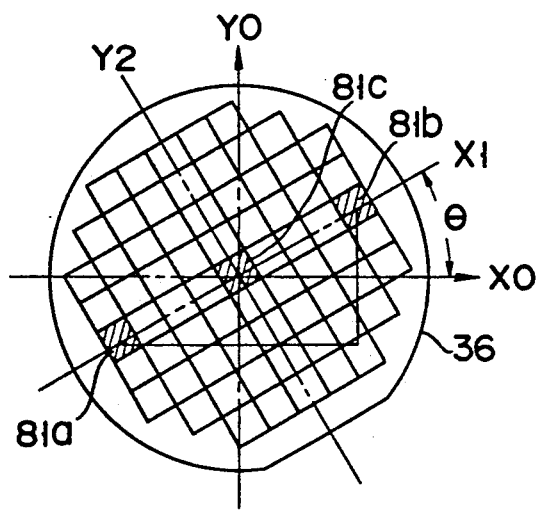

For the fine alignment, table 37a on which wafer 36 is mounted is moved to a position below alignment optical spot 72. An image of the surface of wafer 36 is picked up by TV camera 72. Based on data on this image, a displacement of the semiconductor chip on the surface of wafer 36 with respect to $X_0$ and $Y_0$ directions of table 37a is detected. Table 37a is $\theta$-rotated so as to eliminate this displacement, so that the direction of the chip is made to correspond to the coordinates of table 37a. At the same time, as shown in FIG. 8, only perfect semiconductor chips 81 (hatched portion in FIG. 8) are selected, except for imperfect chips formed on the peripheral area of wafer 36. The selected chips are stored as a wafer map. Then, table 37a is moved to a position below probe card 32. As shown in FIGS. 9A and 9B, an electrode portion of semiconductor chip 81C located at the center of wafer 36 is positioned with a tip portion of needle 32a by $\theta$ adjustment by rotation of mounting table 37a. Also, chips 81a and 81b located at both end portions of wafer 36 is subjected to $\theta$ adjustment.

More specifically, as shown in FIG. 9A, table 37a is rotated by an angle of $\theta$, so that the direction of arrangement of the electrodes of all chips on wafer 36 coincides with the coordinates $(X_1, Y_1)$ of probe needle 32a of probe card 32.

Figure 10:
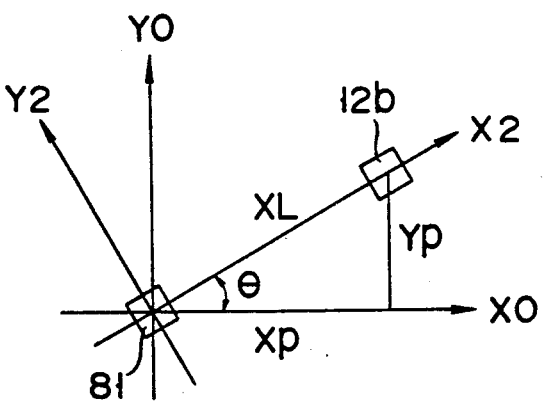

Then, chips 81a and 81b, located at both end portions of wafer 36, are moved to a position below alignment optical spot 72. An image pattern of chips 81a and 81b is detected by camera 71. Thus, the direction of arrangement of the chips, that is, the probe axes $(X_2, Y_2)$ in FIG. 9B are detected and recognized. In other words, table 37a is moved to a position below spot 72 along axes $(X_1, Y_1)$ computed based on rotational angle $\theta$ of table 37a, and an identical image pattern is detected at both end portions of wafer 36; thus, the amount of movement of table 37a at that time is measured and the values of $X_p$ and $Y_p$ in FIG. 10 are found. In this case, the inclination $\theta$ of the axes is given by the following equation (1):

$$\theta = \tan^{-1} \frac{Y_p}{X_p} \tag{1}$$

Figure 11:
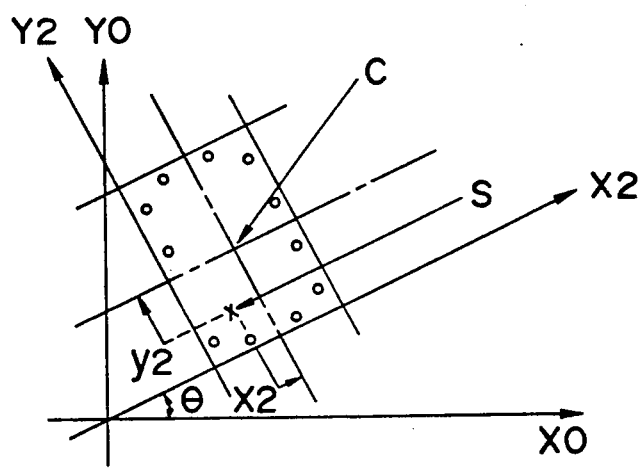

At the time of alignment set-up, characteristic pattern data of the chip pattern is stored, and data on the relative positions of electrodes of the chips are also stored. Based on these data, the characteristic pattern along the axes $(X_2, Y_2)$ is detected, whereby the probe needle can be automatically positioned with the electrode pad of chip 81c at the center of wafer 36 which is displaced by the angle $\theta$. The above-mentioned relative positions specifically mean distances $x_2$ and $y_2$ between characteristic pattern position S and imaginary chip center C, as shown in FIG. 11. The imaginary chip center C is made to coincide with the imaginary center of probe card needle 32a, thus performing the needle positioning.

Distances $x_2$ and $y_2$ are fixed data depending on type of wafer unless the the probe card is reset, and they are stored in control section 23 (see FIG. 2) of the apparatus initially at the time when the pattern data of point S and the present type are set.

The formulas for conversion to the coordinates $(X_0, Y_0)$ of table 37a are as follows:

$$X_0 = \sqrt{X_2^2 + Y_2^2} \cos\left(\tan^{-1}\frac{Y_2}{X_2} + \theta\right) \tag{2}$$

$$Y_0 = \sqrt{X_2^2 + Y_2^2} \sin\left(\tan^{-1}\frac{Y_2}{X_2} + \theta\right) \tag{3}$$

In formulas (2) and (3), $x_0$ and $y_0$ indicate amounts of movement of the $(X_0, Y_0)$ axes of table 37a for correction of position. The value of $\theta$ obtained in formula (1) is used in formulas (2) and (3).

Figure 12:
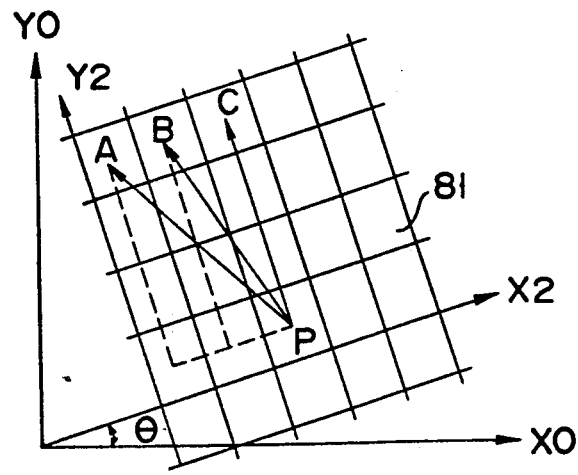

In the above manner, needle 32a of the probe card can be positioned with the electrode pad of chip p at the center of the wafer (FIG. 12). By using the wafer map data (see FIG. 8) of the perfect chips stored before the rotation $\theta$ of wafer 36, perfect chips A, B, and C on the wafer are probed, in this order. In this case, in order to prevent an error of movement from chip to chip, it is necessary that the amount of movement in the axes $(X_0, Y_0)$ is measured after the coordinates of chips A, B, C . . . are computed.

The following formulas (4) and (5) are used for converting the coordinates of the probe axes $(X_2, Y_2)$ to the coordinates of the axes $(X_0, Y_0)$ of table 37a:

$$\vec{X_0} = \vec{X_2} \cos\theta + \vec{Y_2} \sin\theta \tag{4}$$

$$\vec{Y_0} = \vec{Y_2} \cos\theta + \vec{X_2} \sin\theta \tag{5}$$

In FIG. 12, when the position of probing is moved from chip A to chip B, or chip B to chip C, the distance of movement corresponds to the difference of values of coordinates of each chip.

$$\vec{AB} = \vec{B}(xbyb) - \vec{A}(xaya) \tag{6}$$

$$\vec{BC} = \vec{C}(xcyc) - \vec{B}(xbyb) \tag{7}$$

Formulas (6) and (7) are based on the values of the coordinates of the $(X_0, Y_0)$ axes.

In this way, the probing operation can be performed while the probe needle is exactly positioned in relation to all perfect chips on wafer 36.

In the case of a different type of wafer, probe card 32 is changed to another one corresponding to this type, so that the positioning operation can be performed similarly. An automatic prober card exchange mechanism may be used for changing prober card 32, for reducing the workload of an operator.

In order to position probe needle 32a in relation to the electrode of the semiconductor chip, it is possible for the operator to observe by microscope 30 the needle 32a and electrode, and rotate table 37a by the angle $\theta$ manually. Alternatively, it is possible, for example, to mount a specially provided dummy wafer on table 37a and to make needle 37a contact the dummy wafer for putting a needle mark on the wafer. Based on the needle mark, the coordinates $(X_0, Y_n)$ of probe need 32a are recognized, thus making needle 32a correspond to the electrode, with the same advantage as stated above. This method of using the dummy wafer, automatization of the apparatus can be more effectively realized.

Figure 15:
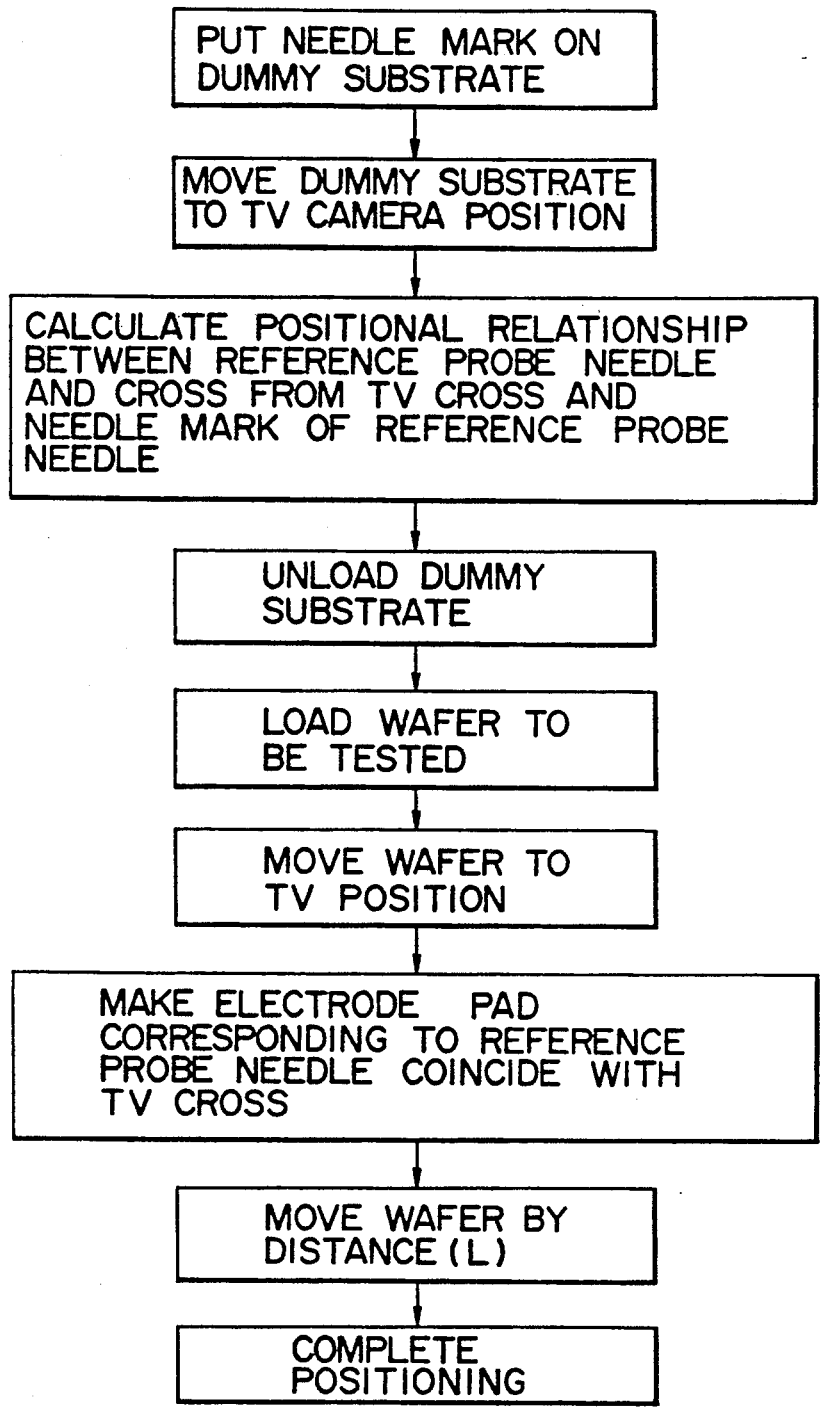

The positioning method using the dummy wafer will now be described with reference to FIGS. 13 to 15. This method is disclosed in Japanese Patent Application No. 63-291718 filed on Nov. 18, 1988 (inventor: Wataru Karasawa; Applicant: Tokyo Electron Kabushiki-Kaisha).

When the check of semiconductor wafer 36 of different type is performed by corresponding probe card 32 in prober section 22, a precise pre-positioning (teaching) is first carried out manually for bringing an arrangement pattern of electrode pad 91 formed on an IC chip into contact with each probe needle 32a mounted on probe card 32.

Figure 17:
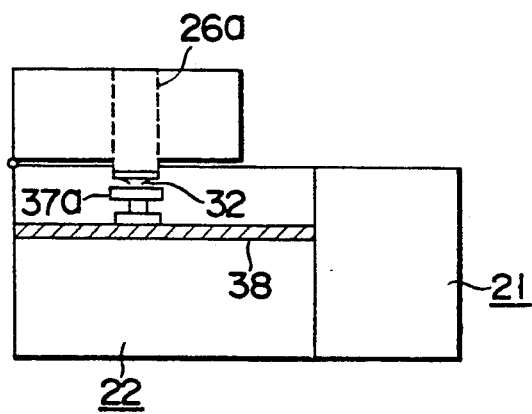

The taught reference data is stored along with a probe card code, so that the subsequent probing operation can be automatically performed. At first, a new type of probe card 32 is set on test head 26 by a probe card automatic exchanging section. The positioning after exchanging probe cards can be effected by a needle mark detection method. Since the position of reference probe needle 32a' corresponding to the new one is known to the operator in advance, the positional relationship between chuck top 37a and reference probe needle 32a' is stored in advance. Then, dummy substrate 92 is loaded on chuck top 37a. For example, dummy substrate 92 is formed by depositing aluminum over the entire surface of a semiconductor wafer. Dummy substrate 92 is automatically moved to a position facing TV camera 71 in order to search an empty area. In other words, to avoid a portion which was already used, a portion of dummy substrate 92, which has no needle mark, is searched. Since the position of chuck top 37a in relation to reference probe needle 32a' has already been stored, chuck top 37a is automatically moved, and an empty area of dummy substrate 92 is located in a position facing each probe needle 32a. In this position, chuck top 37a is raised, and a needle mark of each probe needle 32a' is put on the empty area of dummy substrate 92. Then, dummy substrate 92 on which the needle mark has been impressed is moved into the field of vision of TV camera 71. TV camera 71 picks up an image of an area of the needle mark. This state is shown in FIG. 17. Images of marks (A), (B), (C) and (D) are picked up by TV camera 7. The operator moves chuck top 37a by a joystick, so that cross 93 indicating the center of TV camera 71 is made to coincide with mark (A) put by reference probe needle 32a'. This position ($\alpha_1$) and the positional relationship (L) between cross 93 and reference probe needle 32a' are stored. With the position ($\alpha_1$) being employed as a reference position, imaginary needle positions ($\alpha_2$), ($\alpha_3$) and ($\alpha_4$), in the state wherein probe card 32 is exactly positioned in the $\theta$ rotational direction, are assumed. Thereafter, chuck top 37a is automatically moved in parallel, so that cross 93 is set to the imaginary position ($\alpha_2$). The distance of movement at this time is stored in advance. When cross 93 of TV camera 71 coincides with needle mark (B) after this movement, it is recognized that the direction of $\theta$ rotation of probe card 32 is correct. On the other hand, when cross 93 does not coincide with needle mark (B), it is recognized that the direction of $\theta$ rotation is displaced. If cross 93 does not coincide, the operator controls the joystick to make cross 93 coincide with needle mark (B). By this step, the absolute position ($x_1$, $y_1$) and the angle, $LB\alpha_1\alpha_2=\theta_1$, between needle mark (B) and imaginary position ($\alpha_2$) are calculated. In like manner, the absolute position and the angle are calculated with respect to needle marks (C) and (D), that is, the absolute position ($x_2$, $y_2$) and the angle, $LC\alpha_1\alpha_3=\theta_2$, and between needle mark (C) and imaginary position ($\alpha_3$), and the absolute position ($x_3$, $y_3$) and the angle, $LD\alpha_1\alpha_4=\theta_3$, between needle mark (D) and imaginary position ($\alpha_4$).

Based on the above calculated values, the correction amount for probe card 32 is calculated using the following formula (8):

$$\text{Correction Amount} = \{(\text{Maximum Values of } \theta_1, \theta_2 \text{ and } \theta_3) + (\text{Minimum Values of } \theta_1, \theta_2 \text{ and } \theta_3)\}/2 \quad (8)$$

Based on the correction amount found by formula (8), stage 38 is rotated, and chuck top 37a is positioned in the $\theta$ rotational direction. After the correction, in order to confirm the correct positioning of probe card 32, a needle mark of probe needle 32a is put once again on the empty area of dummy substrate 92. Thus, the correction amount is calculated in the same manner as above. If the calculated values $x_1$, $x_2$, $x_3$, and $y_1$, $y_2$ and $y_3$ fall within a predetermined range of errors, it is considered that the $\theta$ rotational direction of probe card 32 has been corrected. If these values do not fall with the predetermined range of errors, the above correction amount calculation is repeated until the $\theta$ rotational direction of probe card 32 is corrected.

Then, the correction of the X-Y position is performed using the following formula (9). For example, the correction of the X-Y position is performed based on the distance (x, y) between the card position and the optical system found by the detection of the needle mark of reference probe needle 32a', and the amount of displacement of the needle mark of another probe needle 32.

$$\begin{aligned}
X &= x + \{(\text{Maximum Values of } x1, x2 \text{ and } x3) + \\
&\quad (\text{Minimum Values of } x1, x2 \text{ and } x3)\}/2 \\
Y &= y + \{(\text{Maximum Values of } y1, y2 \text{ and } y3) + \\
&\quad (\text{Minimum Values of } y1, y2 \text{ and } y3)\}/2
\end{aligned} \quad (9)$$

The values obtained from formula (9) are stored.

Thereafter, dummy substrate 92 is unloaded, and wafer 36 to be checked is loaded on chuck top 37a. By referring to, for example, scribe lines of wafer 36, macroscopic $\theta$ adjustment between the X-Y direction of wafer 36 and the X-Y direction of movement of chuck top 37a. Then, more precise microscopic $\theta$ adjustment is performed. At first, wafer 36 is set to a position facing TV camera 71. In this position, a given point of chip 81 is picked up by TV camera 71 and stored. Thus, the distance between the given position of chip 81 and reference probe needle 32a' is determined. Simultaneously, image data is stored. Then, chuck top 37a is moved by a distance corresponding to the chip size, and an image of the resultant position thereof is picked up by TV camera 71. The output of this image is compared with the above stored image data, to detect the parallelism. This process is repeated to complete the microscopic $\theta$ adjustment.

The operator controls a joystick (not shown) while observing the image output of TV camera 71, so that electrode pad 91 of chip 81 corresponding to reference probe needle 32a' is made to coincide with cross 93 of TV screen. This position of coincidence is stored. Chuck top 37a is automatically moved by a distance (L) between reference probe needle 32a' and TV cross 93 calculated in the above process, so that each probe needle 32a of probe card 32 is positioned with each electrode pad 91 of chip 81.

As stated above, the data obtained in the teaching step is stored and used as reference data. FIG. 15 is a flowchart of the operation steps for positioning without the use of the microscope. The test of wafer 36 is started as follows: Mounting table or test stage 37a on which wafer 36 is mounted is vertically raised. Electrode pad 91 of chip 81 is brought into contract with each probe needle 32a of probe card 32. In this contact state, electric characteristics of the IC chip are tested by test head 26.

In this case, since the distance of wiring between test head 26 and probe card 32 is short, more precise testing of high-frequency wave can be performed.

The above process is repeated until the test is completed.

The $\theta$ adjustment can also be performed by rotating the test head itself.

Regarding Z-directional movement, in the apparatus of FIG. 3, the distance between probe card 32 and wafer 36 is longer than that in a conventional prober apparatus by a degree corresponding to the insert ring mechanism (about 20 mm or more). Thus, by this degree, the Z-stroke of chuck top 37a is increased, and needle pattern 32a of probe card 32 is brought into contact with the bonding pad pattern of the chip of wafer 36.

Figure 16:
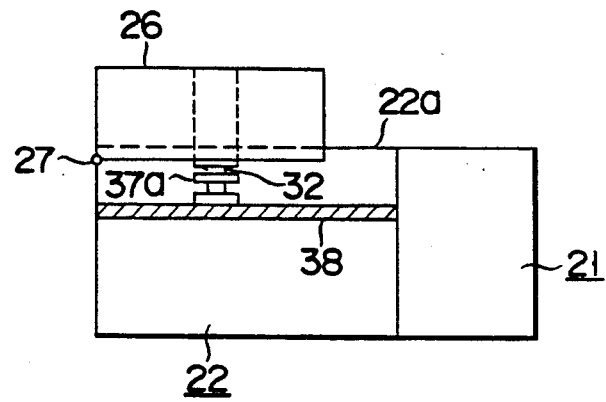
FIGS. 16 and 17 are views for explaining different embodiments of the wafer prober apparatus of the present invention.

Alternatively, as shown in FIG. 16, hinge 27 of test head 26 may be located at a point lower than uppermost portion 22a of prober section 22, so that when test head 26 is set in the test position, probe card 32 is located in a position corresponding to the contact point in a conventional apparatus.

According to the positioning process described with reference to FIGS. 7 to 15, it is not necessary to use microscope 30. Thus, as shown in FIG. 17 it is possible to omit the microscope, provide a pin electronics board at an area corresponding to microscope insertion hole 26a of test head 26, provide projection portion 26b at the area 26a, and fix probe card 32 at the end portion of projection portion 26b.

What is claimed is:

1. A prober apparatus for testing high-frequency characteristics of chips, a number of which are formed on a semiconductor wafer, one-by-one sequentially, said apparatus comprising:
    a probe card having probes which are brought into electrical contact with terminals densely formed on the chips, to test the high-frequency characteristics of the chips;
    a test head for generating a test signal in accordance with an instruction from a tester, and supplying the test signal to the chips through the probe card;
    a support means, comprising a hinge for movably connecting said test head to the prober apparatus so as to allow the test head to be moved between a test position and a retreat position by movement of the test head;
    a performance board forming a fixed surface of a housing of said test head facing said probe card, said performance board and said probe card being fixed relative to an external reference point;
    a fixed immovable connecting means for detachably connecting the probe card directly to the stationary performance board;
    a fixed immovable electrically coupling means for electrically connecting the probe card to the performance board;
    a mounting table on which said semiconductor wafer to be tested is mounted;
    an automatic alignment mechanism coupled to said mounting table, for performing alignment of reference points of said probe card and said mounting table, said automatic alignment mechanism moving only said mounting table in the directions of X, Y, Z and $\theta$, said test head and said probe card being maintained stationary;
    means for operating said automatic alignment mechanism in accordance with a prestored data; and
    a microscope inserted in a hole formed in said test head to enable observation of contact between the probes of said probe card and the terminals of one of said chips.

2. The apparatus according to claim 1, wherein said connecting means comprises screws.

3. The apparatus according to claim 1, wherein said electrically coupling means comprises pogo-pins.

4. The apparatus according to claim 1, wherein said electrically coupling means comprises contact pads.

* * * * *